(12) United States Patent
Bae et al.

(10) Patent No.: US 10,529,676 B2
(45) Date of Patent: Jan. 7, 2020

(54) SEMICONDUCTOR ASSEMBLY WITH PACKAGE ON PACKAGE STRUCTURE AND ELECTRONIC DEVICE INCLUDING THE SAME

(71) Applicant: Samsung Electronics Co., Ltd., Gyeonggi-do (KR)

(72) Inventors: Ki Cheol Bae, Suwon-si (KR); Chul Woo Park, Suwon-si (KR); Kwang Sub Lee, Yongin-si (KR); Sang Gyun Lee, Osan-si (KR); Se Young Jang, Seongnam-si (KR); Chi Hyun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/617,973

(22) Filed: Jun. 8, 2017

(65) Prior Publication Data
US 2017/0358544 A1    Dec. 14, 2017

(30) Foreign Application Priority Data
Jun. 8, 2016    (KR) .................. 10-2016-0070671

(51) Int. Cl.
*H01L 23/64*    (2006.01)
*H01L 25/10*    (2006.01)
(Continued)

(52) U.S. Cl.
CPC .......... *H01L 23/645* (2013.01); *H01L 23/642* (2013.01); *H01L 25/105* (2013.01);
(Continued)

(58) Field of Classification Search
CPC . H01L 25/043; H01L 25/0657; H01L 25/074; H01L 25/0756; H01L 25/117;
(Continued)

(56) References Cited

U.S. PATENT DOCUMENTS 6,272,020 B1    8/2001    Tosaki et al.
6,713,871 B2    3/2004    Searls et al.
(Continued)

FOREIGN PATENT DOCUMENTS

JP    H11-260999 A    9/1999
JP    2009-224817 A    10/2009
(Continued)

OTHER PUBLICATIONS

Communication from a foreign patent office in a foreign counterpart application, European Search Report for Application No. EP17175078.9, dated Nov. 8, 2017, 19 pages.
(Continued)

*Primary Examiner* — Julia Slutsker

(57) ABSTRACT

A semiconductor assembly with a package on package (POP) structure includes a first semiconductor package having a first lower substrate, a first upper substrate facing the first lower substrate, and a first semiconductor chip mounted on an area of the first lower substrate. The POP structure further includes a second semiconductor package having a second lower substrate stacked on the first semiconductor package and spaced apart from the first semiconductor package, and a second semiconductor chip mounted in an area of the second lower substrate. At least one passive element is disposed in one of the first upper substrate and the second lower substrate and electrically connected to the second semiconductor chip.

20 Claims, 9 Drawing Sheets

1000a

(51) Int. Cl.
*H01L 25/18* (2006.01)
*H01L 49/02* (2006.01)
*H01L 25/16* (2006.01)
H01L 23/31 (2006.01)
H01L 23/00 (2006.01)

(52) U.S. Cl.
CPC .............. *H01L 25/16* (2013.01); *H01L 25/18* (2013.01); *H01L 28/40* (2013.01); *H01L 23/3128* (2013.01); *H01L 24/16* (2013.01); *H01L 24/29* (2013.01); *H01L 24/32* (2013.01); *H01L 24/48* (2013.01); *H01L 24/73* (2013.01); *H01L 24/83* (2013.01); *H01L 24/92* (2013.01); *H01L 2224/0401* (2013.01); *H01L 2224/04042* (2013.01); *H01L 2224/16227* (2013.01); *H01L 2224/2919* (2013.01); *H01L 2224/32225* (2013.01); *H01L 2224/48091* (2013.01); *H01L 2224/48195* (2013.01); *H01L 2224/48227* (2013.01); *H01L 2224/73204* (2013.01); *H01L 2224/73265* (2013.01); *H01L 2224/83851* (2013.01); *H01L 2224/92247* (2013.01); *H01L 2225/1023* (2013.01); *H01L 2225/1041* (2013.01); *H01L 2225/1058* (2013.01); *H01L 2225/1076* (2013.01); *H01L 2924/1434* (2013.01); *H01L 2924/1436* (2013.01); *H01L 2924/1437* (2013.01); *H01L 2924/1438* (2013.01); *H01L 2924/15159* (2013.01); *H01L 2924/15311* (2013.01); *H01L 2924/15331* (2013.01); *H01L 2924/19041* (2013.01); *H01L 2924/19105* (2013.01); *H01L 2924/30101* (2013.01); *H01L 2924/30107* (2013.01)

(58) Field of Classification Search
CPC ..... H01L 23/645; H01L 23/642; H01L 25/00; H01L 25/16; H01L 25/105
See application file for complete search history.

(56) References Cited

U.S. PATENT DOCUMENTS

| | | | |
|---|---|---|---|
| 7,049,692 B2 | 5/2006 | Nishimura et al. | |
| 7,135,758 B2 | 11/2006 | Searls et al. | |
| 7,808,075 B1* | 10/2010 | Cheng | H01L 23/60 |
| | | | 257/528 |
| 8,253,228 B2 | 8/2012 | Kim et al. | |
| 8,355,262 B2 | 1/2013 | Inoue et al. | |
| 8,552,566 B1 | 10/2013 | Zeta et al. | |
| 8,624,364 B2 | 1/2014 | Chow et al. | |
| 8,736,073 B2 | 5/2014 | Kunimoto | |
| 9,324,657 B2 | 4/2016 | Seo et al. | |
| 9,391,052 B2 | 7/2016 | Kubota et al. | |
| 9,620,462 B2 | 4/2017 | Zeta et al. | |
| 2003/0218235 A1 | 11/2003 | Searls et al. | |
| 2004/0155335 A1 | 8/2004 | Searls et al. | |
| 2004/0178508 A1 | 9/2004 | Nishimura et al. | |
| 2008/0174978 A1 | 7/2008 | Inoue et al. | |
| 2011/0210436 A1 | 9/2011 | Chow et al. | |
| 2011/0241168 A1* | 10/2011 | Kim | H01L 25/0657 |
| | | | 257/532 |
| 2011/0316119 A1* | 12/2011 | Kim | H01G 2/065 |
| | | | 257/532 |
| 2013/0307113 A1 | 11/2013 | Kunimoto | |
| 2014/0084416 A1* | 3/2014 | Kang | H01L 25/105 |
| | | | 257/532 |
| 2014/0210082 A1 | 7/2014 | Kubota et al. | |
| 2015/0050777 A1 | 2/2015 | Zeta et al. | |
| 2015/0130041 A1* | 5/2015 | Seo | H01L 23/3128 |
| | | | 257/686 |
| 2015/0206865 A1* | 7/2015 | Yu | H01L 25/18 |
| | | | 257/737 |

FOREIGN PATENT DOCUMENTS

| | | |
|---|---|---|
| JP | 201316008 A | 5/2013 |
| JP | 2013243175 A | 12/2013 |
| KR | 20110109616 A | 10/2011 |
| KR | 20110139983 A | 12/2011 |
| KR | 20150053484 A | 5/2015 |
| KR | 10-2015-0104466 A | 9/2015 |

OTHER PUBLICATIONS

European Patent Office, "Communication pursuant to Article 94(3) EPC," Application No. EP17175078.9, dated May 23, 2019, 8 pages.

* cited by examiner

SEMICONDUCTOR ASSEMBLY WITH PACKAGE ON PACKAGE STRUCTURE AND ELECTRONIC DEVICE INCLUDING THE SAME

CROSS-REFERENCE TO RELATED APPLICATION(S)

This application claims the benefit under 35 U.S.C. § 119(a) of a Korean patent application filed on Jun. 8, 2016, in the Korean Intellectual Property Office and assigned Ser. number 10-2016-0070671, the entire disclosure of which is hereby incorporated by reference.

TECHNICAL FIELD

The present disclosure relates to the disposition of a passive element based on a package on package structure.

BACKGROUND

In correspondence to the high integration of electronic devices, a degree of integration of semiconductor packages mounted on the electronic devices also increases. Accordingly, package structures for realizing a higher integration in a limited space have been suggested. For example, a package on package (POP) structure in which a plurality of semiconductor packages are vertically stacked, instead of a planar mounting structure, may realize high integration and allow more efficient design of a space of an electronic device.

The semiconductor chip with the POP structure may process data of a high capacity at a high speed. In this case, signals output from the semiconductor chips (or delivered to the semiconductor chips) may be coupled to a parasitic inductance component in the semiconductor package to cause noise, causing a logical defect to the system.

SUMMARY

Aspects of the present disclosure are to address at least the above-mentioned problems and/or disadvantages and to provide one or more advantages such as those described below. Accordingly, an aspect of the present disclosure is to provide a semiconductor assembly with a POP structure that may minimize inductance components existing in a wiring path between a passive element, which is included in the POP structure with a design for reducing the inductance component in the semiconductor package, and a semiconductor chip by disposing the passive element such that the passive element is close to the semiconductor chip, and an electronic device.

A semiconductor assembly with a POP structure according to various embodiments may include a first semiconductor package, a second semiconductor package, and at least one passive element (e.g., a decoupling capacitor). The first semiconductor package may include a first lower substrate, a first upper substrate facing the first lower substrate, and a first semiconductor chip mounted on an area of the first lower substrate. The second semiconductor package may include a second lower substrate stacked on the first semiconductor package and spaced apart from the first semiconductor package, and a second semiconductor chip mounted in an area of the second lower substrate. At least one passive element may be disposed in one of the first upper substrate or the second lower substrate and electrically connected to the second semiconductor chip.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1A:
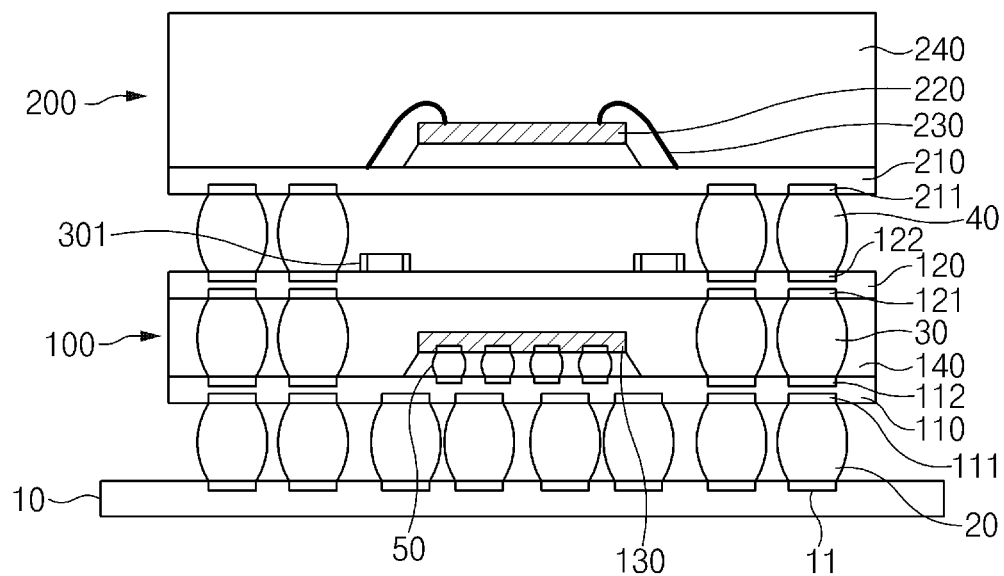
FIG. 1A is a view illustrating a form according to a first embodiment of the present disclosure, in which a decoupling capacitor is disposed in a first semiconductor package with a POP structure.

Hereinafter, various embodiments of the present disclosure will be described with reference to the accompanying drawings. Accordingly, those of ordinary skill in the art will recognize that modification, equivalent, and/or alternative on the various embodiments described herein can be variously made without departing from the scope and spirit of the present disclosure. With regard to the description of the drawings, similar components may be marked by similar reference numerals.

In the disclosure disclosed herein, the expressions "have", "may have", "include" and "comprise", or "may include" and "may comprise" used herein indicate existence of corresponding features (e.g., elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments of the present disclosure, but do not limit the elements. For example, such terms are used only to distinguish an element from another element and do not limit the order and/or priority of the elements. For example, a first semiconductor package and a second semiconductor package may represent different semiconductor devices irrespective of sequence or importance. For example, without departing the scope of the present disclosure, a first element may be referred to as a second element, and similarly, a second element may be referred to as a first element.

It will be understood that when an element (e.g., a first element) is referred to as being "(operatively or electrically) coupled with/to" or "connected to" another element (e.g., a second element), it can be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there is no intervening element (e.g., a third element).

According to the situation, the expression "configured to" used herein may be used as, for example, the expression "suitable for", "having the capacity to", "designed to", "adapted to", "made to", or "capable of". The term "configured to" does not mean "specifically designed to" in hardware. Instead, the expression "a device configured to" may mean that the device is "capable of" operating together with another device or other components.

Terms used in this specification are used to describe specified embodiments of the present disclosure and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

A semiconductor assembly with a package on package (POP) structure according to various embodiments of the present disclosure may be applied to an electronic device that requires high integration, high capacity, and high-speed data processing. Further, the semiconductor assembly may be applied to an electronic device in which a plurality of elements is integrated in a limited space (that is, a density of elements is high) that causes restrictions on design.

An electronic device according to various embodiments of the present disclosure may include at least one of smartphones, tablet personal computers (PCs), mobile phones, video telephones, electronic book readers, desktop PCs, laptop PCs, netbook computers, workstations, personal digital assistants (PDAs), portable multimedia players (PMPs), MP3 players, mobile medical devices, cameras, and wearable devices.

Hereinafter, a semiconductor assembly with a POP structure according to various embodiments of the present disclosure will be described with reference to the accompanying drawings.

FIG. 1A is a view illustrating a form according to a first embodiment of the present disclosure, in which a decoupling capacitor is disposed in a first semiconductor package with a POP structure.

Referring to FIG. 1A, the semiconductor assembly 1000a with a POP structure may include a first semiconductor package 100, a second semiconductor package 200, and at least one passive element 301 (e.g., a decoupling capacitor).

The semiconductor assembly 1000a with a POP structure may have a form in which a second semiconductor package 200 is stacked on the first semiconductor package 100. Then, the first semiconductor package 100 and the second semiconductor package 200 may be spaced apart from each other at a specific interval by an electrode layer (e.g., conductive bumps 40) or an insulation layer. The at least one decoupling capacitor 301 may be disposed adjacent to a semiconductor chip in the POP structure to damp a resistance or inductance component generated on a wiring path of the POP structure.

The first semiconductor package 100 may include a first lower substrate 110, a first upper substrate 120, and a first semiconductor chip 130.

Each of the first lower substrate 110 and the first upper substrate 120 may include a printed circuit board including at least one conductive pattern. Each of the first lower substrate 110 and the first upper substrate 120 may have a single layer or a multilayered structure in which a plurality of insulation layers each with a conductive pattern included therein is stacked. In the case of the multilayered structure, the conductive patterns included in the layers may be mutually electrically connected to each other. Further, the first lower substrate 110 and the first upper substrate 120 may have corresponding shapes. For example, the first lower substrate 110 and the first upper substrate 120 may have the same or similar longitudinal and transverse widths (that is, have the same or similar areas and shapes) to be arranged without any protruding portion when they are stacked.

The lower substrate 110 may be stacked on a main board 10 (e.g., a printed circuit board) while having a specific interval therebetween. In this regard, a first conductive bump 20 is disposed in the spacing space between the first lower substrate 110 and the main board 10, and at least one first lower surface pad 111, a portion of which is exposed, may be formed on a lower surface of the first lower substrate 110. The first lower surface pad 111 may be electrically connected to a conductive pattern included in the first lower substrate 110. The first lower surface pad 111 may be connected (or electrically connected) to one end of the first conductive bump 20, and an opposite end of the first conductive bump 20 may be connected (or electrically connected) to a pad 11 formed in the main board 10. Accordingly, the first lower substrate 110 may be supported on the main board 10 by the first conductive bump 20, and may be electrically connected to the main board 10. At least one first upper surface pad 112 for connection (electrical connection) to a second conductive bump 30, a portion of which is exposed, may be formed on an upper surface of the first lower substrate 110. The first upper surface pad 112 also may be electrically connected to the conductive pattern included in the first lower substrate 110.

The first conductive bump 20, and the second and third conductive bumps 30 and 40, which will be described below, for example, may include at least one metal or at least one of a metal alloy, a conductive metal oxide, a conductive polymer, and a conductive composite material. Further, the first to third conductive bumps 20, 30, and 40 are not limited to the shapes and the number of FIG. 1A, and for example, may be variously modified according to the size of the semiconductor package and a wiring path.

The first semiconductor chip 130 may be disposed on the first lower substrate 110 (e.g., at a central portion of an upper side of the first lower substrate 110). For example, the first semiconductor chip 130 may be electrically connected to the first lower substrate 110 through a conductive bump 50. The first semiconductor chip 130, for example, may include a system-on-chip (SOC) type application processor (AP) used for smartphones, tablet PCs, or navigation devices.

The first upper substrate 120 may be stacked on the first lower substrate 110 while having a specific interval therebetween. At least one second lower surface pad 121 may be formed on a lower surface of the first upper substrate 120, and the second conductive bump 30 may be disposed in a spacing space between the first upper substrate 120 and the first lower substrate 110. The second lower surface pad 121 may be electrically connected to a conductive pattern included in the first upper substrate 120. As opposite ends of the second conductive bump 30 is connected (or electrically connected) to the second lower surface pad 121 of the first upper substrate 120 and the first upper surface pad 112 of the first lower substrate 110, the first upper substrate 120 may be supported by the first lower substrate 110 and may be electrically connected to the first lower substrate 110. At least one second upper surface pad 122 for connection (electrical connection) to a third conductive bump 40, a portion of which is exposed, may be formed on an upper surface of the first upper substrate 120.

The first semiconductor package 100 may further include a first molding layer 140. The first molding layer 140 may be formed in the spacing space between the first lower substrate 110 and the first upper substrate 120. The first molding layer 140 may be formed by filling a molding material between the first lower substrate 110 and the first upper substrate 120 such that the molding layer 140 surrounds the second conductive bump 30 and the first semiconductor chip 130 (that is, such that the second conductive bump 30 and the first semiconductor chip 130 are embedded in the molding layer 140). The first molding layer 140, for example, may be formed of an epoxy molding compound, and may shield and protect the second conductive bump 30 and the first semiconductor chip 130 from an external environment (e.g., heat, moisture, an impact, or the like).

The second semiconductor package 200 may include a second lower substrate 210 and a second semiconductor chip 220. Additionally, the second semiconductor package 200 may further include a second molding layer 240 surrounding the second semiconductor chip 220 on the second lower substrate 210.

The second lower substrate 210 may have a single layer or a multilayered structure in which a plurality of insulation layers are stacked. Each of the layers (the single layer or the multiple layers) constituting the second lower substrate 210 may include at least one conductive pattern, and the conductive patterns of the layers may be mutually electrically connected to each other. Further, the second lower substrate 210 may have areas and shapes that are the same as or similar to those of the above-mentioned first semiconductor package 100 (or the first lower substrate 110 and the first upper substrate 120).

The second lower substrate 210 may be stacked on the first upper substrate 120 while having a specific interval therebetween. At least one third lower surface pad 211 may be formed on a lower surface of the second lower substrate 210, and the third conductive bump 40 may be disposed between the second lower substrate 210 and the first upper substrate 120. The third lower surface pad 211 may be electrically connected to a conductive pattern included in the second lower substrate 210. As the third lower surface pad 211 is connected (or electrically connected) to one end of the third conductive bump 40 and an opposite end of the third conductive bump 40 is connected (or electrically connected) to the second upper surface pad 122 of the first upper substrate 120, the second lower substrate 210 and the first upper substrate 120 may be electrically connected to each other.

The second semiconductor chip 220 may be disposed on the second lower substrate 210 (e.g., at a central portion of an upper side of the second lower substrate 210). The second semiconductor chip 220, for example, may include a volatile memory chip such as a dynamic random access memory (DRAM) or a static random access memory (SRAM). Further, the second semiconductor chip 220 may include a nonvolatile memory chip, such as a flash memory. Further, the second semiconductor chip 220 may include a double data rate synchronous dynamic random access memory (DDR SDRAM) chip used for a mobile device. The second semiconductor chip 220 may be mounted on an upper side of the second lower substrate 210 through a flip chip bonding method. Further, the second semiconductor chip 220, for example, may be mounted on the second lower substrate 210 by using a bonding member, such as a UV film, a thermosetting adhesive, a laser curing adhesive, an ultrasonic curing adhesive, a nonconductive film (NCF), an anisotropic conductive film (ACF) or a nonconductive paste (NCP).

A pad (not illustrated), a portion of which is exposed, may be formed on an upper surface of the second semiconductor chip 220. In this regard, as the pad may be bonded to one end of the conductive wire 230 and an opposite end of the conductive wire 230 may be bonded to the second lower substrate 210, the second semiconductor chip 220 and the second lower substrate 210 may be electrically connected to each other. A plurality of second semiconductor chips 220 may be stacked, and the stacked chips may be electrically connected to each other through a through-silicon via method As described above, the second semiconductor package 200 may further include a conductive wire 230 and a second molding layer 240 surrounding the second semiconductor chip 220. The second molding layer 240 may shield and protect the conductive wire 230 and the second semiconductor chip 220 from the outside. The width of the molding layer 240 may correspond to the area of the second lower substrate 210.

At least one decoupling capacitor 301 may include electrodes on opposite side surfaces thereof and a dielectric membrane (not illustrated) between the electrodes. The decoupling capacitor 301 may have a multilayered structure in which metal insulator metal (MIM) structures are stacked. The decoupling capacitor 301 may function to help supply electric power to the second semiconductor chip 220. A current value may instantaneously increase, causing a voltage drop phenomenon if a processing rate per unit time increases in the second semiconductor chip 220 (that is, a high current is required by the second semiconductor chip 220), and then the decoupling capacitor 301 may be helpful. For example, the second semiconductor chip 220 processes data of a high capacity at a high speed, a power supply unit (not illustrated) of the electronic device may supply electric power to the second semiconductor chip 220. In this process, the decoupling capacitor 301 may help to supply electric power to the second semiconductor chip 220 by supplying charged power to the second semiconductor chip 220. Then, as the decoupling capacitor 301 and the second semiconductor chip 220 are disposed very close to each other, a resistance or inductance component due to the wiring path between the decoupling capacitor 301 and the second semiconductor chip 220 may be minimized. Based on the fact, the decoupling capacitor 301 may supply optimized supply of electric power to the second semiconductor chip 220.

In the first embodiment in which the decoupling capacitor 301 is disposed in the first semiconductor package 100, the decoupling capacitor 301 may be mounted on an upper side of the first upper substrate 120. The decoupling capacitor 301 may be electrically connected to at least one conductive pattern included in the first upper substrate 120. Accordingly, the decoupling capacitor 301 may be electrically connected to the external power supply unit (not illustrated) electrically connected to the main board 10, the main board 10, and a conductive path (a lower conductive path with respect to the decoupling capacitor 301) including the first conductive bump 20, pads 111 and 112 and a conductive pattern of the first lower substrate 110, the second conductive bump 30, and pads 121 and 122 and a conductive pattern of the first upper substrate 120. Further, the decoupling capacitor 301 may be electrically connected to a conductive path (an upper conductive path with respect to the decoupling capacitor 301) including the pads 121 and 122 and the conductive pattern of the first upper substrate 120, the third conductive bump 40, the pad 211 and the conductive pattern of the second lower substrate 210, and the conductive wire 230. That is, the second semiconductor chip 220 may receive electric power based on the lower and upper conductive paths with respect to the above-mentioned decoupling capacitor 301.

An embodiment of the decoupling capacitor 301 may be mounted at a location of an upper area of the first upper substrate, at which the lower and upper conductive paths may be formed through a shortest wiring distance. For example, the decoupling capacitor 301 may be mounted to be maximally adjacent to the third conductive bump 40 so that the wiring lines of the lower conductive path and the upper conductive path may be shortened.

Figure 1B:
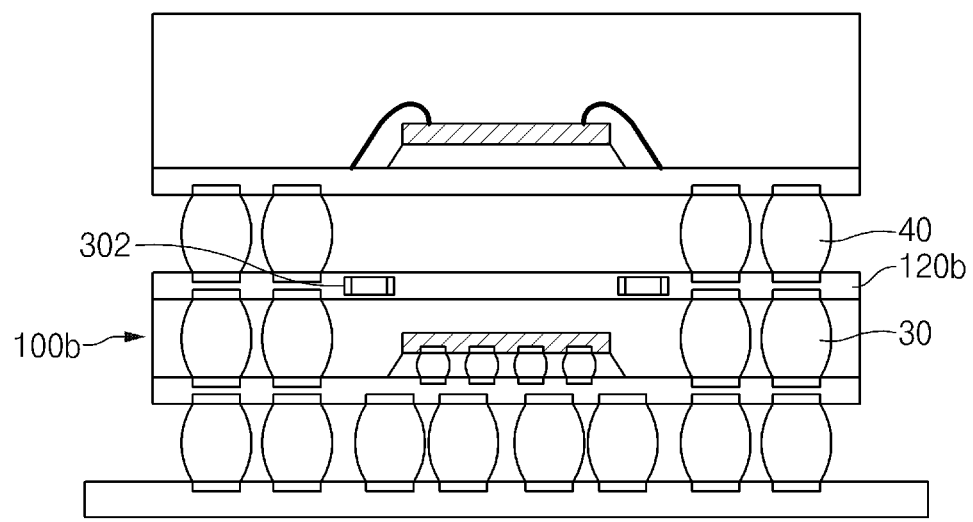
FIG. 1B is a view illustrating a form according to a second embodiment of the present disclosure, in which a decoupling capacitor is disposed in a first semiconductor package with a POP structure.

FIG. 1B illustrates another example in which the decoupling capacitor is disposed in the first semiconductor package. The elements of FIG. 1B, which are the same as or correspond to those of FIG. 1A, may be denoted by the same reference numerals or may be omitted. However, the reference numerals (e.g., 302) of FIG. 1B, which are different from those (e.g., 301) of FIG. 1A are given for convenience of description, and it is noted that the elements are not limited to different elements.

FIG. 1B is a view illustrating a form according to a second embodiment of the present disclosure, in which a decoupling capacitor is disposed in a first semiconductor package with a POP structure.

In the second embodiment in which the decoupling capacitor 302 is disposed in the first semiconductor package 100b, the decoupling capacitor 302 may be embedded in the first upper substrate 120b. For example, the decoupling capacitor 302 may be embedded at a location of the interior area of the first upper substrate 120b, which is adjacent to the second conductive bump 30 or the third conductive bump 40. The decoupling capacitor 302 may be electrically connected to the conductive pattern included in the first upper substrate 120b. The decoupling capacitor 302 may be electrically connected to a conductive path that is the same as or corresponds to the conductive path (that is, the lower and upper conductive paths with respect to the decoupling capacitor (301 of FIG. 1A)) described with reference to FIG. 1A. In this way, if the decoupling capacitor 302 is embedded in the first upper substrate 120b, a space due to disposition of the decoupling capacitor 302 may be excluded from the POP structure so that the POP structure may be designed variously and simply.

FIGS. 2A to 2F illustrate various embodiments in which the decoupling capacitor is disposed in the second semiconductor package. The elements of FIG. 2A to 2F, which are the same as or correspond to those of FIG. 1A, may be denoted by the same reference numerals or may be omitted. However, the reference numerals (e.g., 300a to 300f) of FIGS. 2A to 2F, which are different from those (e.g., 301) of FIG. 1A are given for convenience of description, and it is noted that the elements are not limited to different elements.

Figure 2A:
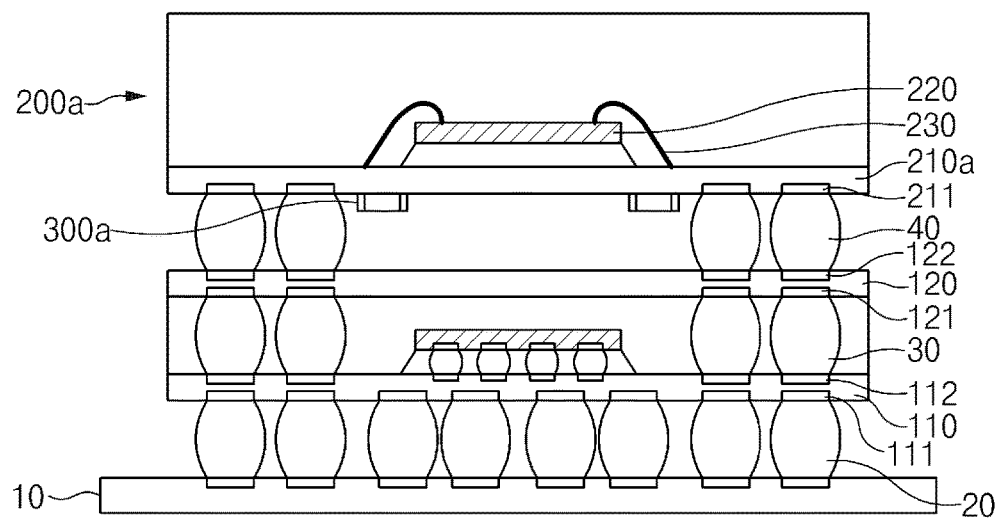
FIG. 2A is a view illustrating a form according to a first embodiment of the present disclosure, in which a decoupling capacitor is disposed in a second semiconductor package with a POP structure.

FIG. 2A is a view illustrating a form according to a first embodiment of the present disclosure, in which a decoupling capacitor is disposed in a second semiconductor package with a POP structure.

Referring to FIG. 2A, the decoupling capacitor 300a may be mounted on a lower side of the second lower substrate 210a included in the second semiconductor package 200a to be adjacent to the second semiconductor chip 220. The decoupling capacitor 300a may be electrically connected to at least one conductive pattern included in the second lower substrate 210a. Accordingly, the decoupling capacitor 300a may be electrically connected to the external power supply unit (not illustrated) electrically connected to the main board 10, the main board 10, and a conductive path (a lower conductive path with respect to the decoupling capacitor 300a) including the first conductive bump 20, pads 111 and 112 and a conductive pattern of the first lower substrate 110, the second conductive bump 30, pads 121 and 122 and a conductive pattern of the first upper substrate 120, a third conductive bump 40, and pads 211 and a conductive pattern of the second lower substrate 210a. Further, the decoupling capacitor 300a may be electrically connected to a conductive path (an upper conductive path with respect to the decoupling capacitor 300a) including a pad 211 and a conductive pattern of the second lower substrate 210a and a conductive wire 230. Accordingly, the second semiconductor chip 220 may receive electric power based on the lower and upper conductive paths with respect to the above-mentioned decoupling capacitor 300a. An embodiment of the decoupling capacitor 300a may be mounted at a location of a lower area of the second lower substrate 210a, at which the above-mentioned conductive paths may be formed through a shortest wiring distance. For example, the decoupling capacitor 300a may be mounted to be maximally adjacent to the third conductive bump 40, the wiring lines of the lower conductive path with respect to the decoupling capacitor 300a, which extends to the main board 10, and the upper conductive path with respect to the decoupling capacitor 300a, which extends to the conductive wire 230, may be shortened.

Figure 2B:
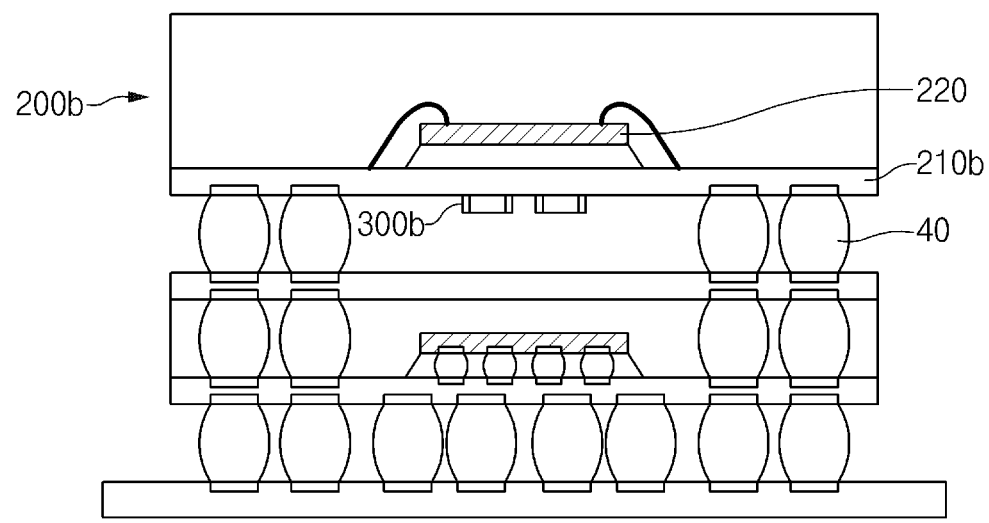
FIG. 2B is a view illustrating a form according to a second embodiment of the present disclosure, in which a decoupling capacitor is disposed in a second semiconductor package with a POP structure.

FIG. 2B is a view illustrating a form according to a second embodiment of the present disclosure, in which a decoupling capacitor is disposed in a second semiconductor package with a POP structure.

In the second embodiment in which the decoupling capacitor 300b is disposed in the second semiconductor package 200b, the decoupling capacitor 300b may be mounted at a center of a lower side of the second lower substrate 210b. The decoupling capacitor 300b may be electrically connected to at least one conductive pattern included in the second lower substrate 210b. Accordingly, the second semiconductor chip 220 may receive electric power through conductive paths that are the same as or correspond to the conductive paths (that is, the lower and upper conductive paths with respect to the decoupling capacitor (300a of FIG. 2A)) described with reference to FIG. 2A. In this way, if the decoupling capacitor 300b is mounted in a lower central area of the second lower substrate 210b, a lower space of the second lower substrate 210b may be easily designed. For example, according to occasions, the disposition of the third conductive bump 40 may be changed or an additional element may be disposed.

Figure 2C:
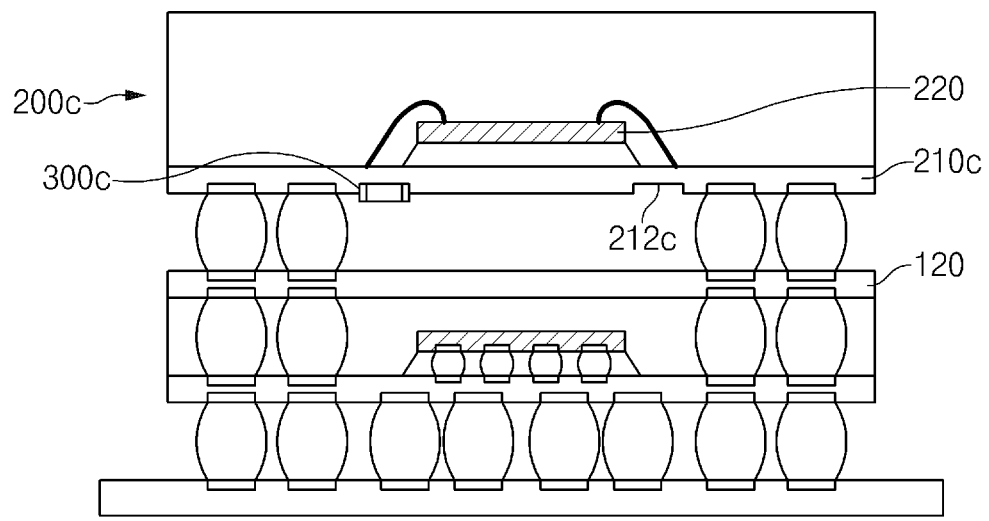
FIG. 2C is a view illustrating a form according to a third embodiment of the present disclosure, in which a decoupling capacitor is disposed in a second semiconductor package with a POP structure.

FIG. 2C is a view illustrating a form according to a third embodiment of the present disclosure, in which a decoupling capacitor is disposed in a second semiconductor package with a POP structure.

In the third embodiment in which the decoupling capacitor 300c is disposed in the second semiconductor package 200c, at least a portion of the decoupling capacitor 300c may be inserted into and mounted in the second lower substrate 210c. In this regard, at least one insertion recess 212c having a specific depth may be formed on a lower surface of the second lower substrate 210c. The insertion recess 212c may have a shape and an area corresponding to those of the decoupling capacitor 300c to be firmly engaged with the decoupling capacitor 300c. Further, a fixing member or a bonding member (not illustrated) for fixing the inserted decoupling capacitor 300c may be disposed inside the insertion recess 212c. The decoupling capacitor 300c may be inserted into and mounted in the insertion recess 212c to be electrically connected to the conductive pattern included in the second lower substrate 210c. Accordingly, the second semiconductor chip 220 may receive electric power through conductive paths that are the same as or correspond to the conductive paths (that is, the lower and upper conductive paths with respect to the decoupling capacitor (300a of FIG. 2A) described with reference to FIG. 2A. In this way, if at least a portion of the decoupling capacitor 300c is inserted into and mounted in the second lower substrate 210c, the physical overlapping of the decoupling capacitor 300c and the first upper substrate 120 may be avoided even though the capacity or size of the decoupling capacitor 300c increases.

Figure 2D:
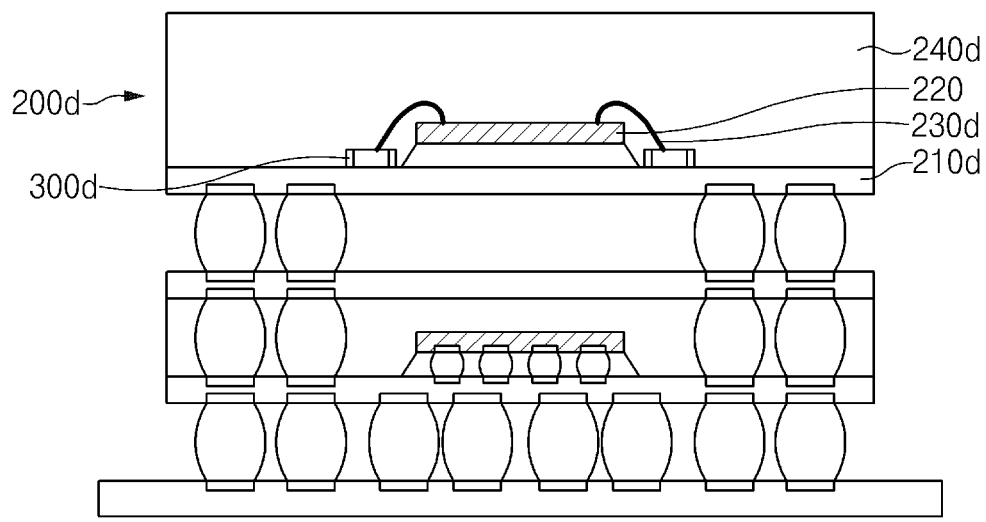
FIG. 2D is a view illustrating a form according to a fourth embodiment of the present disclosure, in which a decoupling capacitor is disposed in a second semiconductor package with a POP structure.

FIG. 2D is a view illustrating a form according to a fourth embodiment of the present disclosure, in which a decoupling capacitor is disposed in a second semiconductor package with a POP structure.

In the fourth embodiment in which the decoupling capacitor 300d is disposed in the second semiconductor package 200d, the decoupling capacitor 300d may be mounted on an upper side of the second lower substrate 210d. For example, the decoupling capacitor 300d may be embedded in the molding layer 240d and be mounted on an upper side of the second lower substrate 210d. The decoupling capacitor 300d may be electrically connected to at least one conductive pattern included in the second lower substrate 210d. The decoupling capacitor 300d may be directly connected to one end of the conductive wire 230d, an opposite end of which is connected to the second semiconductor chip 220. The decoupling capacitor 300d and the one end of the conductive wire 230d may be connected to each other through bonding. In this way, if the decoupling capacitor 300d is mounted on an upper side of the second lower substrate 210d and is directly connected to the conductive wire 230d, the wiring path of the decoupling capacitor 300d to the second semiconductor chip 220 may become shorter and thus current supply efficiency or inductance reduction efficiency may be improved.

Figure 2E:
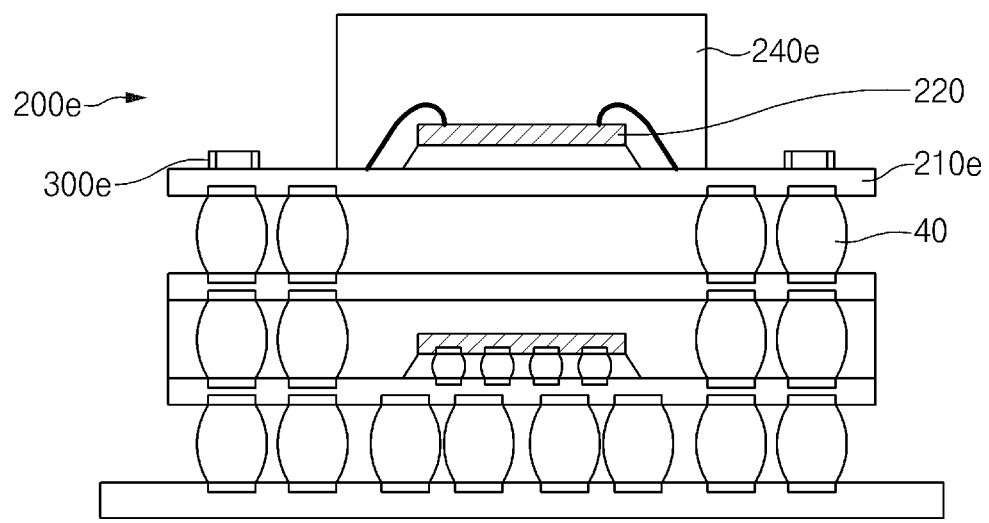
FIG. 2E is a view illustrating a form according to a fifth embodiment of the present disclosure, in which a decoupling capacitor is disposed in a second semiconductor package with a POP structure.

FIG. 2E is a view illustrating a form according to a fifth embodiment of the present disclosure, in which a decoupling capacitor is disposed in a second semiconductor package with a POP structure.

In the fifth embodiment in which the decoupling capacitor 300e is disposed in the second semiconductor package 200e, the decoupling capacitor 300e may be mounted outside of the molding layer 240e on an upper side of the second lower substrate 210e. For example, the decoupling capacitor 300e may be mounted at a location of an outer area of the molding layer 240e, which is close to the third conductive bump 40. The decoupling capacitor 300e may be electrically connected to at least one conductive pattern included in the second lower substrate 210e. Accordingly, the second semiconductor chip 220 may receive electric power through conductive paths that are the same as or correspond to the conductive paths (that is, the lower and upper conductive paths with respect to the decoupling capacitor (300a of FIG. 2A)) described with reference to FIG. 2A. In this way, when the widthwise area or volume of the molding layer 240e is reduced, the high-capacity decoupling capacitor 300e may be mounted on the second lower substrate 210e as an upper space of the second lower substrate 210e, from which the molding layer 240e is excluded, is secured.

Figure 2F:
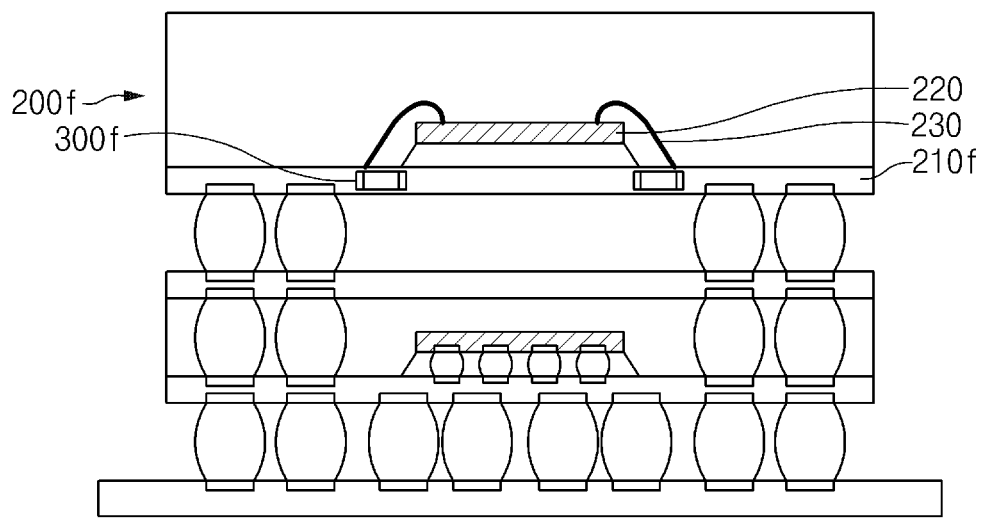
FIG. 2F is a view illustrating a form according to a sixth embodiment of the present disclosure, in which a decoupling capacitor is disposed in a second semiconductor package with a POP structure.

FIG. 2F is a view illustrating a form according to a sixth embodiment of the present disclosure, in which a decoupling capacitor is disposed in a second semiconductor package with a POP structure.

In the sixth embodiment in which the decoupling capacitor 300f is disposed in the second semiconductor package 200f, the decoupling capacitor 300f may be embedded in the second lower substrate 210f. For example, the decoupling capacitor 300f may be embedded at a location of the interior area of the second lower substrate 210f, which is adjacent to the conductive wire 230 (that is, on a lower side of a point at which the conductive wire 230 and the second lower substrate 210f is bonded to each other). The decoupling capacitor 300f may be electrically connected to at least one conductive pattern included in the second lower substrate 210f. When the second lower substrate 210f has a multilayered structure, the decoupling capacitor 300f may be electrically connected to all of the conductive patterns of the layers of the second lower substrate 210f or may be selectively connected to the conductive patterns. Accordingly, the second semiconductor chip 220 may receive electric power through conductive paths that are the same as or correspond to the conductive paths (that is, the lower and upper conductive paths with respect to the decoupling capacitor (300a of FIG. 2A)) described with reference to FIG. 2A. In this way, if the decoupling capacitor 300f is embedded in the second lower substrate 210f, a space due to disposition of the decoupling capacitor 300f may be excluded from the POP structure so that the POP structure may be designed variously and simply.

Figure 3:
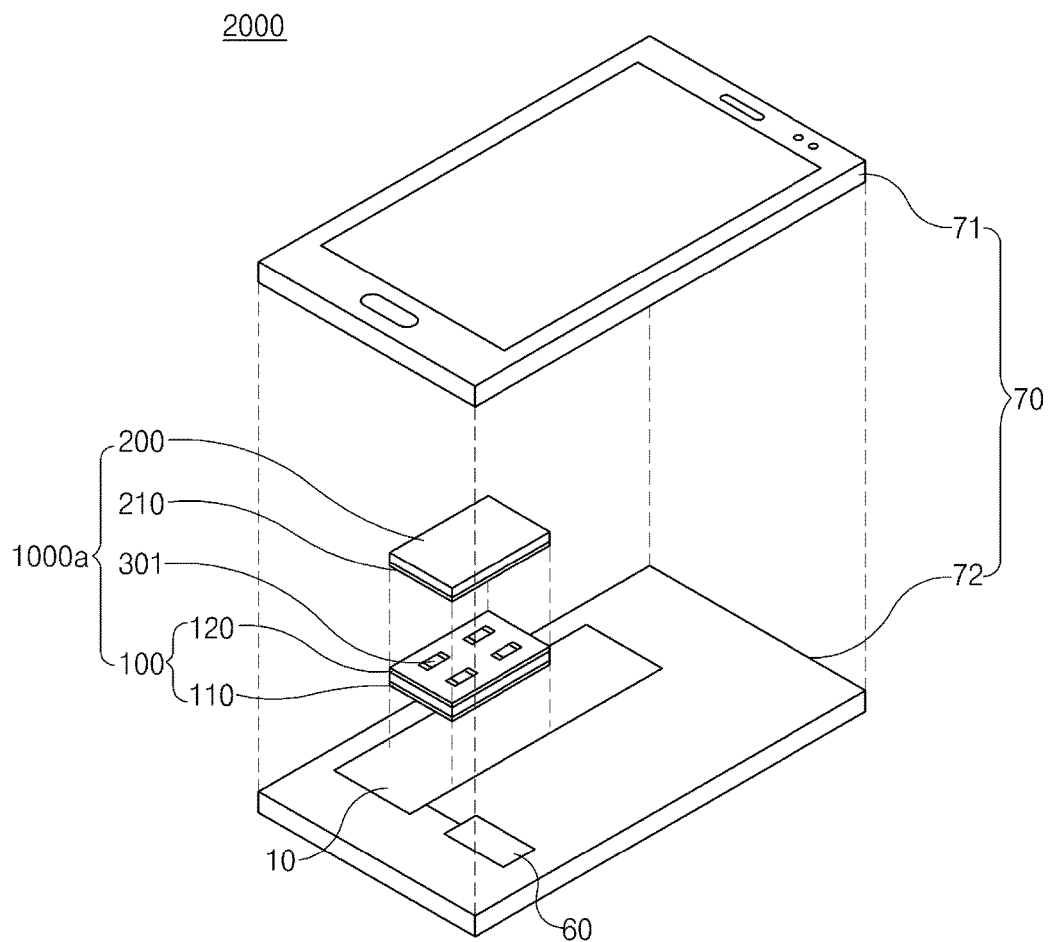
FIG. 3 is a view illustrating a configuration of an electronic device, on which a semiconductor assembly with a POP structure is mounted.

FIG. 3 is a view schematically illustrating a configuration of an electronic device, on which a semiconductor assembly with a POP structure according to an embodiment of the present disclosure is mounted.

The elements of FIG. 3, which are the same as or correspond to those of FIG. 1A, may be denoted by the same reference numerals or may be omitted. Although FIG. 3 illustrating the semiconductor assembly with a POP structure according to the first embodiment, in which a passive element is disposed in the first semiconductor package described above with reference to FIG. 1A is disposed, the semiconductor assemblies with a POP structure according to various embodiments, which have been described with reference to FIGS. 1B to 2F, may be mounted to the electronic device.

Referring to FIG. 3, the electronic device 2000 may include a housing 70, a semiconductor assembly 1000a with a POP structure, a main board 10, and a power supply unit 60.

The housing 70 may be formed by coupling the first case 71 and the second case 72. A main board 10 (e.g., a printed circuit board) and a power supply unit 60 (e.g., a battery) electrically connected to the main board 10 may be disposed within the housing 70 (that is, inside the second case 72). The power supply unit 60 may supply electric power to the semiconductor assembly 1000a with a POP structure through the main board 10.

The semiconductor assembly 1000a with a POP structure may include a first semiconductor package 100, a second semiconductor package 200, and at least one passive element 301 (e.g., the decoupling capacitor 301 of FIG. 1A). The first semiconductor package 100 may include a first lower substrate 110, a first semiconductor chip (not illustrated) (e.g., the first semiconductor chip 130 of FIG. 1A) disposed on the first lower substrate 110, and a first upper substrate 120 facing the first lower substrate 110. The second semiconductor package 200 may include a second lower substrate 210, and a second semiconductor chip (not illustrated) (e.g., the second semiconductor chip 220 of FIG. 1A) disposed on the second lower substrate 210.

The semiconductor assembly 1000a with a POP structure may be mounted on an upper side of the main board 10 while having a specific interval therebetween. For example, the semiconductor assembly 1000a with a POP structure may be mounted on an upper side of the main board 10 in a package on package method in which the first semiconductor package 100 is stacked on an upper side of the main board 10 and the second semiconductor package 200 is stacked on an upper side of the semiconductor package 100. Then, conductive bumps (not illustrated) (e.g., the first conductive bump 20 and the third conductive bump 40 of FIG. 1A) may be disposed between the main board 10 and the first semiconductor package 100 and between the first semiconductor package 100 and the second semiconductor package 200 to be electrically connected to each other and be physically supported by each other. Further, the conductive bump (not illustrated) (e.g., the second conductive bump 30 of FIG. 1A) may be disposed even between the first lower substrate 110 and the first upper substrate 120 of the first semiconductor package 100.

The decoupling capacitor 301 may be disposed in at least one of the first semiconductor package 100 and the second semiconductor package 200 and may be electrically connected to the second semiconductor chip (not illustrated) included in the second semiconductor package 200. As mentioned above, the decoupling capacitor 301 may be disposed in at least one of the interior of the first upper substrate 120, a lower side of the second lower substrate 210, an upper side of the second lower substrate 210, and the interior of the second lower substrate 210, in addition to an upper side of the first upper substrate 120 to be electrically connected to the second semiconductor chip (not illustrated). The decoupling capacitor 301 disposed in this way may help supply electric power to the second semiconductor chip (not illustrated). For example, if the second semiconductor chip (not illustrated) processes data of a high capacity or at a high speed, the decoupling capacitor 301 may help power be supplied by the power supply unit 60 by supplying charged electric power to the second semiconductor chip (not illustrated).

A semiconductor assembly with a POP structure according to various embodiments may include a first semiconductor package, a second semiconductor package, and at least one passive element.

According to various embodiments, the first semiconductor package may include a first lower substrate, a first upper substrate facing the first lower substrate, and a first semiconductor chip mounted on an area of the first lower substrate.

According to various embodiments, the second semiconductor package may include a second lower substrate stacked on the first semiconductor package and spaced apart from the first semiconductor package, and a second semiconductor chip mounted in an area of the second lower substrate.

According to various embodiments, at least one passive element may be disposed in at least one of the first semiconductor package and the second semiconductor package and electrically connected to the second semiconductor chip.

According to various embodiments, the first semiconductor chip may include an application processor (AP) chip, and the second semiconductor chip may include a memory chip.

According to various embodiments, the first lower substrate, the first upper substrate, and the second lower substrate may have corresponding areas or shapes.

According to various embodiments, at least one of the first lower substrate, the first upper substrate, or the second lower substrate may include a printed circuit board having a multilayered structure in which each layer includes at least one conductive pattern.

According to various embodiments, the semiconductor assembly may include a main board.

According to various embodiments, the first lower substrate may be stacked on the main board and spaced apart from the main board.

According to various embodiments, the semiconductor assembly may further include at least one of at least one first conductive bump electrically connecting the first lower substrate and the main board, at least one second conductive bump electrically connecting the first lower substrate and the first upper substrate, or at least one third conductive bump electrically connecting the first upper substrate and the second lower substrate.

According to various embodiments, the passive element may be mounted on a lower side of the second lower substrate.

According to various embodiments, the passive element may be electrically connected to a conductive path taking the main board, the first conductive bump, pads and a conductive pattern of the first lower substrate, the second conductive bump, pads and a conductive pattern of the first upper substrate, the third conductive bump, and pads and a conductive pattern of the second lower substrate as a route.

According to various embodiments, the passive element may be electrically connected to a conductive path taking at least one conductive wire electrically connecting the second lower substrate and the second semiconductor chip and pads and a conductive pattern of the second lower substrate as a route.

According to various embodiments, the passive element may be mounted adjacent to the third conductive bump.

According to various embodiments, the second semiconductor package may further include at least one insertion recess formed on a lower side of the second lower substrate to have a specific depth.

According to various embodiments, at least a portion of the passive element may be inserted into and mounted in the insertion recess.

According to various embodiments, the passive element may be mounted on an upper side of the second lower substrate.

According to various embodiments, the second semiconductor package may further include at least one conductive wire electrically connecting the second lower substrate and the second semiconductor chip.

According to various embodiments, the passive element may be directly connected to the conductive wire on the second lower substrate.

According to various embodiments, the passive element may be mounted on an upper side of the first upper substrate.

According to various embodiments, the passive element may be electrically connected to a conductive path taking the main board, the first conductive bump, pads and a conductive pattern of the first lower substrate, the second conductive bump, and pads and a conductive pattern of the first upper substrate as a route.

According to various embodiments, the passive element may be electrically connected to a conductive path taking pads and a conductive pattern of the first upper substrate, the third conductive bump, pads and a conductive pattern of the second lower substrate, and at least one conductive wire electrically connecting the second lower substrate and the second semiconductor chip as a route.

An electronic device according to various embodiments may include a semiconductor assembly with a package on package (POP) structure including a first semiconductor package including a first lower substrate, a first upper substrate facing the first lower substrate, and a first semiconductor chip mounted on an area of the first lower substrate, a second semiconductor package including a second lower substrate stacked on the first semiconductor package and spaced apart from the first semiconductor package, a second semiconductor chip mounted in an area of the second lower substrate, and at least one passive element disposed in at least one of the first semiconductor package and the second semiconductor package and electrically connected to the second semiconductor chip, and a power supply unit configured to supply electric power to the semiconductor assembly in correspondence to control the first semiconductor chip.

According to various embodiments, the passive element may be disposed in at least one of an upper side of the first upper substrate, the interior of the first upper substrate, a lower side of the second lower substrate, an upper side of the second lower substrate, or the interior of the second lower substrate.

According to various embodiments, the semiconductor assembly with the POP structure may further include a main board on which the first semiconductor package is seated.

According to various embodiments, the power supply unit may be disposed on one side of the main board.

According to various embodiments, a wiring path between a semiconductor chip and a passive element may be shortened and simplified by disposing the passive element in a semiconductor assembly having a POP structure such that the passive element is close to the semiconductor chip, and an inductance component generated on the wiring path may be minimized.

In addition, the present disclosure may provide various effects that are directly or indirectly recognized.

Further, the embodiments disclosed in the specification are provided to describe the technical contents or for an understanding of the technical contents, and the technical scope of the present disclosure is not limited thereto. Accordingly, the scope of the present disclosure should be construed to include all changes or various embodiments based on the technical spirit of the present disclosure.

What is claimed is:

1. A semiconductor assembly with a package on package (POP) structure, the semiconductor assembly comprising:
    a first semiconductor package including a first lower substrate, a first upper substrate facing the first lower substrate, and a first semiconductor chip mounted on an area of the first lower substrate;
    a second semiconductor package including a second lower substrate stacked on the first semiconductor package and spaced apart from the first semiconductor package, and a second semiconductor chip mounted in an area of the second lower substrate; and
    at least one passive element electrically connected to the second semiconductor chip and disposed in at least one of:
        in or on the first upper substrate of the first semiconductor package, or
        in, on or below the second lower substrate of the second semiconductor package, and
    wherein an electric power supplied from a power supply unit is supplied to the second semiconductor chip through the at least one passive element,
    wherein a width of the first lower substrate is a same as a width of the second lower substrate, and
    wherein the at least one passive element is disposed to overlap the first lower substrate.

2. The semiconductor assembly of claim 1, wherein the first semiconductor chip includes an application processor (AP) chip, and
    wherein the second semiconductor chip includes a memory chip.

3. The semiconductor assembly of claim 1, wherein the first lower substrate, the first upper substrate, and the second lower substrate have corresponding shapes.

4. The semiconductor assembly of claim 1, wherein at least one of the first lower substrate, the first upper substrate, or the second lower substrate includes a printed circuit board having a multilayered structure in which each layer includes at least one conductive pattern.

5. The semiconductor assembly of claim 4, further comprising:
    a main board,
    wherein the first lower substrate is stacked on the main board and spaced apart from the main board.

6. The semiconductor assembly of claim 5, further comprising at least one of:
    at least one first conductive bump electrically connecting the first lower substrate and the main board;
    at least one second conductive bump electrically connecting the first lower substrate and the first upper substrate; or
    at least one third conductive bump electrically connecting the first upper substrate and the second lower substrate.

7. The semiconductor assembly of claim 6, wherein the at least one passive element is mounted on a lower side of the second lower substrate.

8. The semiconductor assembly of claim 7, wherein the at least one passive element is electrically connected to a conductive path taking the main board, the first conductive bump, pads and a conductive pattern of the first lower substrate, the second conductive bump, pads and a conductive pattern of the first upper substrate, the third conductive bump, and pads and a conductive pattern of the second lower substrate as a route.

9. The semiconductor assembly of claim 7, wherein the at least one passive element is electrically connected to a conductive path taking at least one conductive wire electrically connecting the second lower substrate and the second semiconductor chip and pads and a conductive pattern of the second lower substrate as a route.

10. The semiconductor assembly of claim 7, wherein the at least one passive element is mounted adjacent to the third conductive bump.

11. The semiconductor assembly of claim 7, wherein the second semiconductor package further includes at least one insertion recess formed on a lower side of the second lower substrate to have a specific depth, and
wherein at least a portion of the at least one passive element is inserted into and mounted in the insertion recess.

12. The semiconductor assembly of claim 6, wherein the at least one passive element is mounted on an upper side of the second lower substrate.

13. The semiconductor assembly of claim 12, wherein the at least one passive element is electrically connected to a conductive path taking the main board, the first conductive bump, pads and a conductive pattern of the first lower substrate, the second conductive bump, pads and a conductive pattern of the first upper substrate, the third conductive bump, and pads and a conductive pattern of the second lower substrate as a route.

14. The semiconductor assembly of claim 12, wherein the second semiconductor package further includes at least one conductive wire electrically connecting the second lower substrate and the second semiconductor chip, and
wherein the at least one passive element is directly connected to the conductive wire on the second lower substrate.

15. The semiconductor assembly of claim 6, wherein the at least one passive element is mounted on an upper side of the first upper substrate.

16. The semiconductor assembly of claim 15, wherein the at least one passive element is electrically connected to a conductive path taking the main board, the first conductive bump, pads and a conductive pattern of the first lower substrate, the second conductive bump, and pads and a conductive pattern of the first upper substrate as a route.

17. The semiconductor assembly of claim 16, wherein the at least one passive element is electrically connected to a conductive path taking pads and a conductive pattern of the first upper substrate, the third conductive bump, pads and a conductive pattern of the second lower substrate, and at least one conductive wire electrically connecting the second lower substrate and the second semiconductor chip as a route.

18. An electronic device comprising:
a semiconductor assembly with a package on package (POP) structure including a first semiconductor package including a first lower substrate, a first upper substrate facing the first lower substrate, and a first semiconductor chip mounted on an area of the first lower substrate, a second semiconductor package including a second lower substrate stacked on the first semiconductor package and spaced apart from the first semiconductor package, a second semiconductor chip mounted in an area of the second lower substrate, and at least one passive element electrically connected to the second semiconductor chip and disposed in at least one of: in or on the first upper substrate of the first semiconductor package, or in, on or below the second lower substrate of the second semiconductor package; and
a power supply unit configured to supply electric power to the semiconductor assembly in correspondence to control the first semiconductor chip,
wherein the electric power is supplied to the second semiconductor chip through the at least one passive element, and
wherein a width of the first lower substrate is a same as a width of the second lower substrate,
wherein the at least one passive element is disposed to overlap the first lower substrate.

19. The electronic device of claim 18, wherein the at least one passive element is disposed in at least one of an upper side of the first upper substrate, an interior of the first upper substrate, a lower side of the second lower substrate, an upper side of the second lower substrate, or the interior of the second lower substrate.

20. The electronic device of claim 18, wherein the semiconductor assembly with the POP structure further includes a main board on which the first semiconductor package is seated, and
wherein the power supply unit is disposed on one side of the main board.

* * * * *